(12) United States Patent
Uzelac

(10) Patent No.: US 6,617,874 B2
(45) Date of Patent: Sep. 9, 2003

(54) POWER-UP LOGIC REFERENCE CIRCUIT AND RELATED METHOD

(75) Inventor: Lawrence S. Uzelac, Auburn, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/038,196

(22) Filed: Jan. 2, 2002

(65) Prior Publication Data

US 2003/0122579 A1 Jul. 3, 2003

(51) Int. Cl.[7] .............................................. H03K 19/173
(52) U.S. Cl. ............................... 326/38; 326/31; 326/46
(58) Field of Search ............................. 326/37, 38, 46, 326/31

(56) References Cited

U.S. PATENT DOCUMENTS

| | | | | |
|---|---|---|---|---|
| 4,716,322 A | * | 12/1987 | D'Arrigo et al. | 327/143 |
| 5,247,213 A | * | 9/1993 | Trinh et al. | 326/38 |
| 5,323,067 A | * | 6/1994 | Shay | 327/142 |
| 5,812,462 A | * | 9/1998 | Merritt | 365/189.05 |
| 6,236,249 B1 | * | 5/2001 | Choi et al. | 327/143 |
| 6,281,739 B1 | * | 8/2001 | Matsui | 327/525 |
| 6,400,196 B1 | * | 6/2002 | Aoki et al. | 327/143 |

* cited by examiner

Primary Examiner—Don Le
(74) Attorney, Agent, or Firm—Blakely, Sokoloff, Taylor & Zafman LLP

(57) ABSTRACT

A power-up reference circuit and related method that generates a reference voltage in response to the circuit being powered up. The circuit includes a power-up sensing circuit that generates a set signal, a latch to generate and sustain the reference voltage in response to the set signal, and a reset key decoder to receive an N-bit key and in response thereto generate a reset signal that causes the latch to reset. Upon the circuit being powered up, the power-up sensing circuit generates the set signal which sets the latch to generate the reference voltage. The reference voltage can be used by other circuits to initialize their operating conditions. Once the reference voltage has been used, the N-bit key is generated which causes the decoder to generate the reset signal, which in turn, causes the latch to reset. When the latch is reset, the power-up reference circuit consumes substantially no power.

23 Claims, 2 Drawing Sheets

POWER-UP LOGIC REFERENCE CIRCUIT AND RELATED METHOD

FIELD

This invention relates generally to power-up logic reference circuits that generate one or more known logic voltage levels upon being powered up, and in particular, to a power-up logic reference circuit and related method which reliably generates one or more known voltage levels upon being powered-up, and consumes substantially no power upon being reset.

BACKGROUND

In some cases, logic integrated circuits are sensitive to their power-up logic state condition. That is, in order for this type of logic circuit to function properly, its various nodes should be at particular voltage levels upon the circuit being powered-up. However, if the logic circuit is not designed with consideration for the power-up logic levels, the various nodes may randomly or by noise acquire inappropriate voltage levels at power-up, which may cause the circuit to function improperly or not function at all. In addition, wrong voltage levels at power-up may also cause short-circuit conditions or other unwanted conditions that may cause physical damage to the circuit, such as the short-circuit condition where two push-pull transistors are both turned due to wrong voltage levels at their gates.

Often such logic circuits employ a power-up logic reference circuit that reliably generates one or more known logic voltage levels upon the circuit being powered up. The known voltage levels generated are then used by other logic circuits to set up their initial operating conditions. In this case, the power-up logic reference circuit prevents undesired voltage levels from occurring, thereby reducing the likelihood of circuit malfunction and damage due to wrong voltage levels at power-up. An example of such a power-up logic reference circuit is a resistor divider where one or more intermediate nodes generate reference voltage levels for use by other logic circuits. Typically such a circuit requires a separate reference voltage that is stable and independent of the primary circuit power supply voltage through power supply sequencing techniques.

One drawback of most prior art power-up logic reference circuits is that they typically consume power even when their use is no longer needed. That is, when the one or more logic circuits have used the reference logic levels generated by a power-up logic reference circuit in order to arrive at their initial operating condition, the power-up logic reference circuit is no longer needed. Thus, if this circuit continues to function, it unnecessarily consumes power. For example, the resistor divider previous mentioned consumes power after its reference voltage levels have been used since it continues to draw current from the power supply. Another drawback is that if an independent reference voltage is used for this purpose, the reference supply must be brought on-die and routed to the point

DETAILED DESCRIPTION

Figure 1:
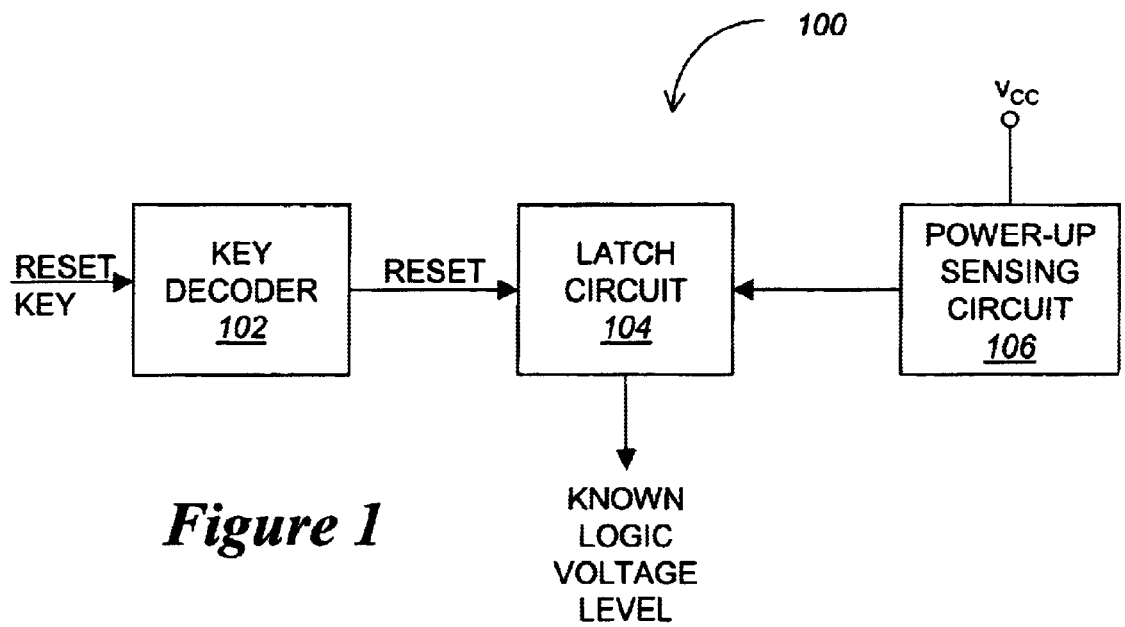
FIG. 1 illustrates a block diagram of an exemplary power-up logic reference circuit in accordance with an embodiment of the invention.

FIG. 1 illustrates a block diagram of an exemplary power-up logic reference circuit 100 in accordance with an embodiment of the invention. The power-up logic reference circuit 100 reliably generates a known (i.e. reference) logic level upon the circuit 100 being powered up. The power-up logic reference circuit 100 also consumes substantially no power upon receiving an appropriate reset key signal. In the exemplary embodiment, the power-up logic reference circuit 100 comprises a key decoder 102, a latch circuit 104, and a power-up sensing circuit 106.

In operation, the power-up sensing circuit 106 is responsive to the ramping of the power supply voltage $V_{CC}$ during power up of the circuit 106. Once the power-up sensing circuit 106 has detected the ramping power supply voltage $V_{CC}$, it generates a voltage that causes the latch circuit 104 to reliably generate and sustain the known logic voltage level. The known logic voltage level may be used by one or more logic circuits to set up their respective initial operating conditions. The power-up sensing circuit 106 consumes some power in generating the known logic voltage level prior to being reset.

After the one or more logic circuits have used the known logic voltage level in setting up their respective initial operating conditions, the power-up sensing circuit 106 is no longer needed to generate the power-up voltage level for the latch circuit. Thus, it would be desirable to place the power-up sensing circuit in a low power consuming mode to prevent waste of power. In this regard, the key decoder 102 receives a particular reset key signal and decodes it to generate a reset signal. The reset signal, in turn, causes the latch circuit 104 to change state, placing the power-up sensing circuit in a low power consuming mode. The reset key may comprise an N-bit word. The use of an N-bit word (assuming N is more than one, i.e. a plurality) prevents or reduces the likelihood that noise and/or some other interference causes the reset key to untimely reset of the latch circuit 104.

Figure 2:
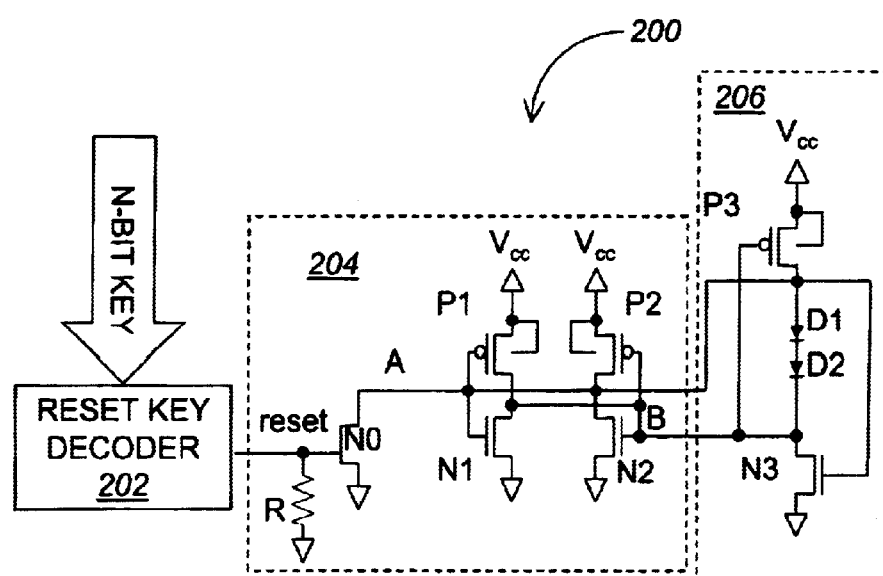
FIG. 2 illustrates a schematic diagram of an exemplary power-up logic reference circuit in accordance with another embodiment of the invention.

FIG. 2 illustrates a schematic diagram of an exemplary power-up logic reference circuit 200 in accordance with a more detailed embodiment of the invention. The power-up logic reference circuit 200 reliably generates a pair of known (i.e. reference) logic voltage levels at nodes A and B upon the circuit 200 being powered up. The power-up logic reference circuit 200 also goes into a low power consuming mode (i.e. consumes substantially no power) upon receiving an appropriate reset key signal. In the exemplary embodiment, the power-up logic reference circuit 200 comprises a key decoder 202, a latch circuit 204, and a power-up sensing circuit 206.

The power-up sensing circuit 206, in turn, comprises a p-channel field effect transistor (FET) P3, a pair of diodes D1 and D2, and an n-channel FET N3. The conduction channel of FET P3, the series-connected diodes D1 and D2, and the conduction channel of FET N3 are connected in series between the power supply rail $V_{CC}$ and ground potential. More specifically, the source of the p-channel FET P3 is connected to the power supply rail $V_{CC}$, the drain of the p-channel FET P3 is connected to the anode of diode D1. The cathode of diode D1 is connected to the anode of diode D2. The cathode of diode D2 is connected to the drain of n-channel FET N3. The source of the n-channel FET N3 is connected to ground potential. The gate of the n-channel FET N3 is connected to the drain of the p-channel FET P3, and the gate of the p-channel FET P3 is coupled to the drain of the n-channel FET N3.

The latch circuit 204, in turn, comprises a p-channel FET P1 and an n-channel FET N1 in a push-pull configuration connected between the power supply rail $V_{CC}$ and ground potential. Similarly, the latch circuit 204 further comprises a p-channel FET P2 and an n-channel FET N2 in a push-pull configuration connected between the power supply rail $V_{CC}$ and ground potential. More specifically, the source of p-channel FET P1 is connected to the power supply rail $V_{CC}$, the drain of p-channel FET P1 is connected to the drain of the n-channel FET N1, and the source of the n-channel FET N1 is connected to ground potential. Similarly, the source of p-channel FET P2 is coupled to the power supply rail $V_{CC}$, the drain of p-channel FET P2 is coupled to the drain of the n-channel FET N2, and the source of the n-channel FET N2 is coupled to ground potential. The respective gates of FETs P1 and N1 are connected together, connected to the drains of FETs P2 and N2, connected to the drain of FET P3, and connected to the gate of FET N3. Similarly, the respective gates of FETs P2 and N2 are connected together, connectred to the drains of FETs P1 and N1, connected to the drain of FET N3, and connected to the gate of FET P3.

The latch circuit 204 further comprises an n-channel FET N0 including a drain connected to the gates of FETs P1 and N1, a source connected to ground potential, and a gate connected to the output of the reset key decoder 202. In addition, the latch circuit 204 includes a resistor connected at one end to the gate of FET N0 and at the other end to ground potential. The reset key decoder 202 includes an input to receive an N-bit key and an output to generate the reset signal.

In operation, prior to the powering up of the power-up logic reference circuit 200, the nodes (e.g. nodes A and B) of the circuit 200 are at a unknown potential, at or near ground, but not need be). During power up, the power supply rail ramps up from ground potential to the specified power supply voltage $V_{CC}$ When the power supply voltage $V_{CC}$ is a threshold voltage (of FET P3) above the voltage at node B (i.e. the gate of FET P3), the FET P3 turns on and couples the power supply voltage $V_{CC}$ to node A (i.e. sends a signal to the latch circuit 204). When this occurs, the voltage on node A begins to rise towards $V_{CC}$. Because node A includes the gate of FET N3, the rising voltage on node A makes the FET N3 further conduct, thereby further coupling node B to ground potential. This causes the voltage on node B to dissipate. When the power supply voltage $V_{CC}$ and the voltages on nodes A and B reach steady-state, a known voltage level of approximately $V_{CC}$ is at node A and a known voltage level of approximately ground potential is at node B. Thus, the power-up sensing circuit 206 causes the latch circuit 204 to generate and sustain two known voltage levels at nodes A and B upon the power-up logic reference circuit 200 being powered up.

At power up, the latch circuit 204 is set. That is, the voltage level at node A is high (i.e. approximately $V_{CC}$) which causes FET N1 to conduct, thereby coupling node B to ground. The voltage level at node B being at approximately ground potential causes FET P2 to conduct, thereby coupling the power supply rail to node A. Thus at the "set" state, the latch circuit 204 generates two known reference voltages at nodes A and B for use by one or more other circuits to initialize their operating conditions. At the "set" state, however, the power-up logic reference circuit 200 is drawing current through the power-up detection sub-circuit 206. This is because the high voltage level on node A (i.e. at the gate of FET N3) causes FET N3 to conduct, and the low voltage level on node B (i.e. at the gate of FET P3) causes FET P3 to conduct. Thus, the conduction of both FETs P3 and N3 forms a current path from the power supply rail $V_{CC}$ to ground potential by way of FET P3, forward-biased diodes D1 and D2, and FET N3. It would be desirable to "shut off" the power-up sensing circuit 200 once the known voltage levels at nodes A and B are no longer needed by the other one or more circuits. This is where the reset key decoder 202 comes in.

At which time the known reference voltages at nodes A and B are no longer needed, a predetermined N-bit key is sent to the reset key decoder 202. The reset key decoder 202 decodes the N-bit key and in response thereto generates a reset signal. The reset signal, being applied to the gate of n-channel FET N0 causes the FET N0 to conduct and consequently drive the high voltage at node A down to ground potential. The low voltage now at node A, being also applied to the gates of FETs P1 and N3, causes FET P1 to conduct and FET N3 to cut-off. As a consequence, the low voltage at node B is driven high. Once the voltages reach steady-state, the voltage at node A is approximately at ground potential and the voltage at node B is approximately at the power supply potential $V_{CC}$. Thus, the latch circuit 204 has been reset. The reset signal need only be high for a sufficient amount of time to cause the latch circuit 204 to reset.

In the reset mode, the power-up logic reference circuit 200 consumes substantially no power. This is because the power-up sensing circuit 206 draws substantially no current since both FETs P3 and N3 are in cut-off due to the high voltage at node B (i.e. at the gate of p-channel FET P3) and low voltage at node A (i.e. at the gate of n-channel FET N3). The latch circuit 204 also consumes substantially no current because of the inherent properties of the push-pull configurations of transistor pair P1-N1 and P2-N2. Thus, an advantage of the power-up logic reference circuit 200 is that the power-up sensing circuit 206 reliably places the latch 204 in the "set" mode to generate the known reference voltages at nodes A and B upon the circuit 200 being powered up. And, the reset key decoder 202 reliably places the latch 204 in reset mode where the circuit 200 consumes substantially no power.

The resistor R is employed to discharge any charges remaining on the gate of FET N0 so that when the circuit 200 is powered up, the voltage on the gate of FET N0 is substantially at ground potential. A resistor or other types of resistive elements can perform this function. The diodes D1 and D2 are employed to generate a sufficient voltage offset between nodes A and B to cause the FETs P3 and N3 to turn on hard when the circuit 200 is in "set" mode and to cut off hard when the circuit 200 is in "reset" mode. Other types of voltage off setting devices can be employed in place thereof or in addition to the diodes D1 and D2, such as diode-connected transistors, resistors, etc. Alternatively, the resetting FET N0 may also be a p-channel FET. In such a case, the source of the P-FET is coupled to the power supply rail, the drain is coupled to node B of the latch circuit 204, and the gate receives a low reset signal to cause the latch circuit 204 to reset.

Figure 3:
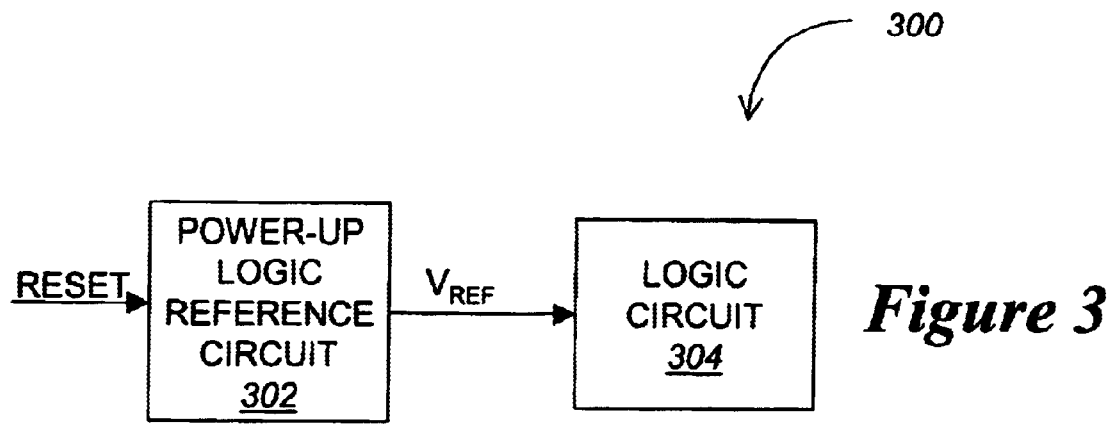
FIG. 3 illustrates a block diagram of an exemplary circuit using an exemplary power-up logic reference circuit in accordance with yet another embodiment of the FIG. 4 illustrates a schematic diagram of an exemplary logic circuit using exemplary power-up logic reference circuit in accordance with still another embodiment of the invention.

FIG. 3 illustrates a block diagram of an exemplary integrated circuit or discrete circuit 300 using an exemplary power-up logic reference circuit in accordance with yet another embodiment of the invention. As previously discussed, one application of the power-up logic reference circuit is to generate one or more logic voltage levels used for initializing other logic circuits. Accordingly, the integrated or discrete circuit 300 comprises a power-up logic reference circuit 302 and a logic circuit 304. Upon the integrated or discrete circuit 300 being powered up, the power-logic reference circuit 302 reliably generates a reference logic level voltage $V_{REF}$. The logic circuit 304 uses the reference voltage $V_{REF}$ to initialize its operation. Once this has occurred, a reset signal is sent to the power-up logic reference circuit 302 to place it in a low power consuming mode.

Figure 4:
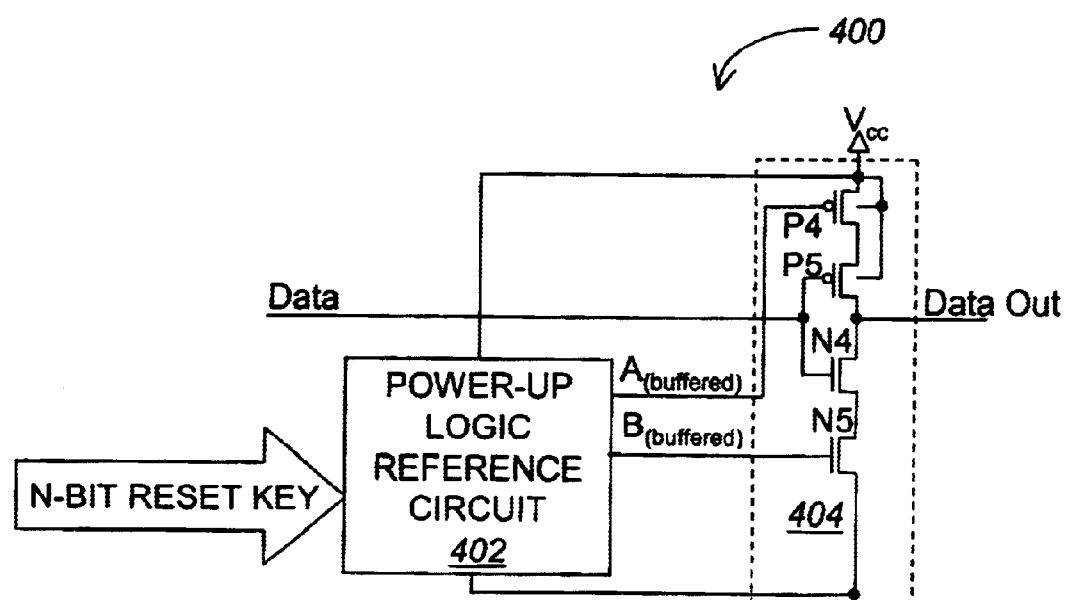

FIG. 4 illustrates a schematic diagram of a more specific exemplary integrated or discrete circuit 400 using an exemplary power-up logic reference circuit in accordance with still another embodiment of the invention. The integrated or discrete circuit 400 comprises a power-up logic reference circuit 402 and an inverter logic circuit 404. The inverter logic circuit 404, in turn, comprises a first p-channel FET P4, a second p-channel FET P5, a first n-channel FET N4, and a second n-channel FET N4, whose conduction channels are connected in series between the power supply rail $V_{CC}$ and ground potential. The gate of the first p-channel FET P4 is connected to an output node A of the power-up logic reference circuit 402. The gate of the second n-channel FET N5 is connected to an output node B of the power-up logic reference circuit 402. The gates of the second p-channel FET P5 and the first n-channel FET N4 are connected together and serve as the input of the inverter logic circuit 404. The drains of the second p-channel FET P5 and the first n-channel FET N4 are connected together and serve as the output of the inverter logic circuit 404.

In operation, upon the circuit 400 being powered up, the power-up logic reference circuit 402 reliably generates a high logic-level voltage at node A and a low logic-level voltage at node B. The high logic level at node A, being connected to the gate of p-channel FET P4, causes FET P4 to be at cut off. The low logic level at node B, being connected to the gate of n-channel FET N5, causes FET N5 to be at cut off. Accordingly, the reference voltage levels on nodes A and B place the inverter logic circuit 404 initially in a tristate mode. Then, upon a desired time, an N-bit reset key is sent to the power-up logic reference circuit 402 to place the power-up logic reference circuit 402 in a low power consuming mode, and to cause the circuit 402 to invert the logic levels at nodes A and B, i.e. a low logic-level at node A and a high logic-level at node B. The low logic-level at node A causes FET P4 to conduct and the high logic-level at node B causes FET N5 to conduct. Thus, at this mode, the inverter logic circuit 404 is no longer in tristate, and is now functional as an inverter.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. An apparatus, comprising:
    a power-up sensing circuit to generate a signal in response to said power-up sensing circuit being powered up;
    a latch circuit to generate and sustain a known reference voltage in response to said signal; and
    a decoder circuit to cause a reduction in a power consumption of said power-up circuit and said latch circuit in response to a reset signal.

2. An apparatus comprising:
    a power-up sensing circuit to generate a signal in response to said power-up sensing circuit being powered up; and
    a latch circuit to generate and sustain a known reference voltage in response to said signal, wherein said power-up sensing circuit comprises:
        a first p-channel field effect transistor (FET) including a first source, a first drain, and a first gate, wherein said first source is connected to a first voltage rail and said first gate is connected to said latch circuit;
        a first n-channel field effect transistor (FET) including a second source, a second drain, and a second gate, said second source being connected to a second voltage rail, said second gate being connected to said latch circuit and to said first drain of said first p-channel FET, and said second drain being connected to said gate of said first p-channel FET; and
        a voltage offsetting device connected between said first drain of said first p-channel FET and said second drain of said first n-channel FET.

3. The apparatus of claim 2, wherein said voltage offsetting device comprises at least one diode.

4. The apparatus of claim 2, wherein said first voltage rail comprises a power supply voltage rail.

5. The apparatus of claim 2, wherein said second voltage rail comprises a ground potential rail.

6. The apparatus of claim 2, wherein said latch circuit comprises:
    a second p-channel FET including a third source, a third drain, and a third gate, said third source being connected to said first voltage rail;
    a second n-channel FET including a fourth source, a fourth drain, and a fourth gate, said fourth source connected to said second voltage rail, said fourth drain connected to said third drain of said second p-channel FET, said fourth gate coupled to said third gate of said second p-channel FET;
    a third p-channel FET including a fifth source, a fifth drain, and a fifth gate, said fifth source being connected to said first voltage rail, said fifth drain being connected to said first, third and fourth gates of respectively said first p-channel FET, said second p-channel FET, and said second n-channel FET; and
    a third n-channel FET including a sixth source, a sixth drain, and a sixth gate, said sixth source being coupled to said second voltage rail, said sixth drain being coupled to said fifth drain of said third p-channel FET and to said first, third and fourth gates of respectively said first p-channel FET, said second p-channel FET, and said second n-channel FET, and said sixth gate being connected to said fifth gate of said third p-channel FET and to said second, third and fourth drains of respectively said first n-channel FET, said second p-channel FET, and said second n-channel FET.

7. The apparatus of claim 6, wherein said latch circuit further comprises a fourth n-channel FET including a seventh source, a seventh drain, and a seventh gate, said seventh source being connected to said second voltage potential, said seventh drain being connected to said second, third, and fourth gates of respectively said first n-channel FET, said second p-channel FET and second n-channel FET, and to said first, fifth and sixth drains of respectively said first p-channel FET, third p-channel FET, and third n-channel FET, and said seventh gate to receive a reset signal.

8. The apparatus of claim 7, further comprising a reset key decoder to generate said reset signal in response to an N-bit key.

9. The apparatus of claim 8, further comprising a resistive element between said seventh gate and said second voltage rail.

10. The apparatus of claim 6, wherein said latch circuit further comprises a fourth p-channel FET including a seventh source, a seventh drain, and a seventh gate, said seventh source being connected to said first voltage potential, said seventh drain being connected to said first, fifth, and sixth gates of respectively said first p-channel FET, said third p-channel FET and said third n-channel FET, and to said second, third and fourth drains of respectively said first n-channel FET, said second p-channel FET, and said second n-channel FET.

11. An apparatus comprising:
a power-up sensing circuit to generate a signal in response to said power-up sensing circuit being powered up; and
a latch circuit to generate and sustain a known reference voltage in response to said signal, wherein said latch circuit comprises:
a first p-channel FET including a first source, a first drain, and a first gate, said first source being connected to a first voltage rail;
a first n-channel FET including a second source, a second drain, and a second gate, said second source being connected to a second voltage rail, said second drain being connected to said first drain of said first p-channel FET, and said second gate connected to said first gate of said first p-channel FET;
a second p-channel FET including a third source, a third drain, and a third gate, said third source being connected to said first voltage rail, said third drain being connected to said first and second gates of respectively said first p-channel FET and said first n-channel FET, and to said power-up sensing circuit; and
a second n-channel FET including a fourth source, a fourth drain, and a fourth gate, said fourth source being connected to said second voltage rail, said fourth drain being coupled to said third drain of said second p-channel FET, to said first and second gates of respectively said first p-channel FET and said first n-channel FET, and to said power-up sensing circuit, and said fourth gate being connected to said third gate of said second p-channel FET, to said first and second drains of respectively said first p-channel FET and said first n-channel FET, and to said power-up sensing circuit.

12. A circuit comprising:
a power-up sensing circuit to generate a set signal in response to said power-up sensing circuit being powered up;
a latch circuit to generate a reference logic level voltage and an inverted reference logic voltage in response to said set signal; and
a logic circuit to use said reference logic level voltage and/or said inverted reference logic voltage, wherein said inverter comprises:
a first p-channel field effect transistor (FET) including a first source, a first drain, and a first gate, said first source coupled to a first voltage rail and said first gate coupled to said latch circuit to receive said reference logic level voltage;
a second p-channel field effect transistor (FET) including a second source, a second drain, and a second gate, said second source connected to said first drain of said first p-channel FET;
a first n-channel field effect transistor (FET) including a third source, a third drain, and a third gate, said third drain coupled to said second drain of said second p-channel transistor and serving as an output for said inverter, and said third gate coupled to said second gate of said second p-channel FET and serving as an input for said inverter; and
a second n-channel field effect transistor (FET) including a fourth source, a fourth drain, and a fourth gate, said fourth source connected to a second voltage rail, said fourth drain coupled to said third source of said first n-channel FET, and said fourth gate connected to said latch circuit to receive said inverted reference logic level voltage.

13. A method comprising:
providing a power-up sensing circuit to generate a set signal in response to an activation of a power supply voltage;
setting a latch using said set signal to generate a reference voltage; and
resetting said latch and reducing a power consumption of said power-up sensing circuit in response to a reset signal.

14. The method of claim 13, further comprising using said reference voltage to initialize an operating condition of a circuit.

15. The method of claim 13, wherein generating said set signal comprises turning on a transistor to generate said set signal.

16. The method of claim 13, wherein resetting said latch comprises generating a reset signal which causes said latch to reset.

17. The method of claim 16, wherein generating said reset signal comprises:
receiving an N-bit key; and
decoding said N-bit key to generate said reset signal.

18. The method of claim 16, wherein said reset signal turns on a transistor which causes said latch to reset.

19. A circuit comprising:
a power-up sensing circuit to generate a set signal in response to said power-up sensing circuit being powered up;
a latch circuit to generate a reference logic level voltage and an inverted reference logic voltage in response to said set signal; and
a logic circuit to use said reference logic level voltage and/or said inverted reference logic voltage, wherein said latch circuit comprises:
a first p-channel FET including a first source, a first drain, and a first gate, said first source being connected to a first voltage rail;
a first n-channel FET including a second source, a second drain, and a second gate, said second source being connected to a second voltage rail, said second drain being connected to said first drain of said first p-channel FET, and said second gate being connected to said first gate of said first p-channel FET;
a second p-channel FET including a third source, a third drain, and a third gate, said third source being connected to said first voltage rail, said third drain being connected to said first and second gates of respectively said first p-channel FET and said first n-channel FET, and to said power-up sensing circuit; and a second n-channel FET including a fourth source, a fourth drain, and a fourth gate, said fourth source being connected to said second voltage rail, said fourth drain connected to said third drain of said second p-channel FET, to said first and second gates of respectively said first p-channel FET and said first n-channel FET, and to said power-up sensing circuit, and said fourth gate connected to said third gate of said second p-channel FET, to said first and second drains of respectively said first p-channel FET and said first n-channel FET, and to said power-up sensing circuit.

20. A circuit, comprising:

a power-up sensing circuit to generate a set signal in response to said power-up sensing circuit being powered up;

a latch circuit to generate a reference logic level voltage and an inverted reference logic voltage in response to said set signal; and a decoder circuit to cause a reduction in a power consumption of said power-up circuit and said latch circuit in response to a reset signal; and a logic circuit to use said reference logic level voltage and/or said inverted reference logic voltage.

21. The circuit of claim 20, wherein said logic circuit comprises an inverter.

22. A circuit comprising:

a power-up sensing circuit to generate a set signal in response to said power-up sensing circuit being powered up;

a latch circuit to generate a reference logic level voltage and an inverted reference logic voltage in response to said set signal; and a logic circuit to use said reference logic level voltage and/or said inverted reference logic voltage, wherein said power-up sensing circuit comprises:

a first p-channel field effect transistor (FET) including a first source, a first drain, and a first gate, wherein said first source is coupled to a first voltage rail and said first gate is connected to said latch circuit;

a first n-channel field effect transistor (FET) including a second source, a second drain, and a second gate, said second source being connected to a second voltage rail, said second gate being connected to said latch circuit and to said first drain of said first p-channel FET, and said second drain being coupled to said first gate of said first p-channel FET; and a voltage offsetting device connected between said first drain of said first p-channel FET and said second drain of said first n-channel FET.

23. The circuit of claim 22, wherein said latch circuit comprises:

a second p-channel FET including a third source, a third drain, and a third gate, said third source being connected to said first voltage rail;

a second n-channel FET including a fourth source, a fourth drain, and a fourth gate, said fourth source connected to said second voltage rail, said fourth drain being connected to said third drain of said second p-channel FET, said fourth gate being connected to said third gate of said second p-channel FET;

a third p-channel FET including a fifth source, a fifth drain, and a fifth gate, said fifth source being connected to said first voltage rail, said fifth drain being connected to said first, third and fourth gates of respectively said first p-channel FET, said second p-channel FET, and said second n-channel FET; and a third n-channel FET including a sixth source, a sixth drain, and a sixth gate, said sixth source connected to said second voltage rail, said sixth drain conected to said fifth drain of said second p-channel FET and to said second, third and fourth gates of respectively said first n-channel FET, said second p-channel FET, and said second n-channel FET, and said sixth gate being coupled to said fifth gate of said third p-channel FET and to said second, third and fourth drains of respectively said first n-channel FET, said second p-channel FET, and said second n-channel FET.

* * * * *

UNITED STATES PATENT AND TRADEMARK OFFICE
CERTIFICATE OF CORRECTION

PATENT NO. : 6,617,874 B2
DATED : September 9, 2003
INVENTOR(S) : Uzelac

It is certified that error appears in the above-identified patent and that said Letters Patent is hereby corrected as shown below:

Column 1,
Line 58, after "point", insert -- of use. --.

Column 2,
Line 3, after "embodiment of the", insert -- invention; and --.

Signed and Sealed this

Fourth Day of May, 2004

JON W. DUDAS
*Acting Director of the United States Patent and Trademark Office*